United States Patent [19]
Gabriagues et al.

[11] Patent Number: 5,345,455
[45] Date of Patent: Sep. 6, 1994

[54] OPTICAL WAVELENGTH CONVERTER CONTROL METHOD AND DEVICE

[75] Inventors: Jean-Michel Gabriagues, Le Val Saint-Germain; Jean-Claude Jacquinot, Le Kremlin-Bicetre; Guy Le Roy, Lannion; Jean-Baptiste Jacob, Perros-Guirec, all of France

[73] Assignee: Alcatel N.V., Amsterdam, Netherlands

[21] Appl. No.: 937,499

[22] Filed: Aug. 28, 1992

[30] Foreign Application Priority Data

Aug. 30, 1991 [FR] France .................. 91 10789

[51] Int. Cl.$^5$ .......................................... H01S 3/10
[52] U.S. Cl. .................................. 372/20; 359/326; 372/32; 372/38
[58] Field of Search .................. 372/20, 29, 32, 38; 359/326

[56] References Cited

U.S. PATENT DOCUMENTS 4,916,705  4/1990  Glance ............................ 372/32
5,255,276  10/1993  Tabuchi et al. ................ 372/32

FOREIGN PATENT DOCUMENTS 0396371  11/1990  European Pat. Off. .
58-073174  5/1983  Japan .

OTHER PUBLICATIONS

Kawaguchi, "Tunable optical wavelength conversion using an optically triggerable multielectrode distributed feedback laser diode", chapters I, III, *IEEE J Quantum Electronics* vol. 24 No. 11, Nov. 1988, pp. 2153–2159.
Yamokoshi, "An optical wavelength conversion laser with tunable range of 30 A", *Optical Fiber Communication Conference* vol. P010 No. 1, New Orleans USA, Jan. 1988, pp. 251–254.

*Primary Examiner*—James W. Davie
*Attorney, Agent, or Firm*—Robbins, Berliner & Carson

[57] ABSTRACT

An optical wavelength converter has an optical signal input adapted to receive an optical signal whose wavelength is to be converted, an optical signal output adapted to emit an optical signal whose wavelength is the required wavelength, after conversion, and at least one control electrode for applying at least one electrical signal to control the wavelength of the output optical signal. The converter is controlled by a method which comprises a calibration phase for establishing a law linking at least one of said control electrical signals to said required output wavelength and storing said law in a storage device, and an operative phase for addressing said storage device using the required output wavelength and numerical-analog conversion of the data from the storage device addressed in this way for application to said control electrode(s).

5 Claims, 9 Drawing Sheets

OPTICAL WAVELENGTH CONVERTER CONTROL METHOD AND DEVICE

BACKGROUND OF THE INVENTION

1. Field of the Invention

The present invention concerns converting the wavelength of optical signals.

2. Description of the Prior Art

The wavelength of optical signals is advantageously used, especially in optical switching or transmission systems, for multiplexing, for example, to enable different optical signals conveyed by a common transmission medium to be distinguished from each other, or for routing or space-division switching purposes, to assign optical signals a particular propagation path from a set of possible propagation paths. The problem frequently arises in such systems of "changing" the wavelength of an optical carrier modulated with the data to be transmitted by these systems.

One way to change the wavelength is to detect said data by means of an optical receiver and then to use the electrical signal produced by this transducer to modulate an optical source, possibly a tunable optical source, emitting at the required wavelength.

Another method which avoids optical-electrical conversion followed by electrical-optical conversion has recently been made possible by a wavelength converter opto-electronic component consisting of a semiconductor laser diode using a tandem electrode structure with a saturable absorber. This laser can be triggered optically and tuned electrically.

A component of this kind is described, for example, in the document: Optical Fiber Communication Conference—New Orleans—Jan. 25, 28 1988: "An optical—wavelength conversion laser with tuneable range of 30 A" S. Yamakoshi, K. Kondo, M. Kuno.

Briefly, it comprises an optical waveguide formed of a series of juxtaposed sections one of which, into which the incident optical signal is injected, incorporates the saturable absorber. These sections are provided with respective control electrodes for applying various electrical control signals, namely in this instance a saturable absorber control signal, a gain control signal and a signal controlling the wavelength of the optical signal emitted by the laser.

The combination of the gain control signal (a current $I_1$, for example) and the saturable absorber control signal (a current $I_2$, for example) defines an operating point of the laser at which the laser may be triggered optically, according to the incident optical power. Moreover, when the laser is actually triggered, the wavelength of the optical signal that it emits is determined by the wavelength control signal.

An object of the present invention is to control an optical wavelength converter component of the type described above, in particular to generate automatically the control signal to be applied to the control electrodes of a component of this kind to obtain the required emission wavelength for a given component.

Depending on the intended application of the wavelength converter, said required emission wavelength may optionally be obtained from specific data included in the incident optical signal applied to the converter; one application where it can be obtained from such specific data is in a photonic switching matrix enabling switching of data in the form of fixed length asynchronous transfer mode cells, in which case said specific data is in the cell header. These cells have a fixed format comprising an information field preceded by a header containing control information.

The invention is particularly beneficial in this application to a photonic switching matrix.

SUMMARY OF THE INVENTION

In one aspect, the present invention consists in a method of controlling an optical wavelength converter according to the required emission wavelength, said wavelength converter having an optical signal input adapted to receive an optical signal whose wavelength is to be converted, an optical signal output adapted to emit an optical signal whose wavelength is the required wavelength, after conversion, and at least one control electrode for applying at least one electrical signal to control the wavelength of the emission optical signal, which method comprises:

a calibration phase comprising:
  establishing a law linking at least one of said control electrical signals to said required emission wavelength,
  storing said law in storage means,
an operative phase comprising:
  addressing said storage means using the required emission wavelength,
  numerical-analog conversion of the data from the storage means addressed in this way for application to said control electrode(s).

In a second aspect, the present invention consists in a device for implementing the above method comprising:
  means for storing said law,
  means for addressing said storage means using the required emission wavelength,
  digital-analog converter means for data obtained from the storage means addressed in this way for application to said control electrode(s).

Other objects and features of the present invention will emerge from the following description of embodiments of the invention given with reference to the appended drawings.

DETAILED DESCRIPTION OF THE INVENTION

Figure 1:
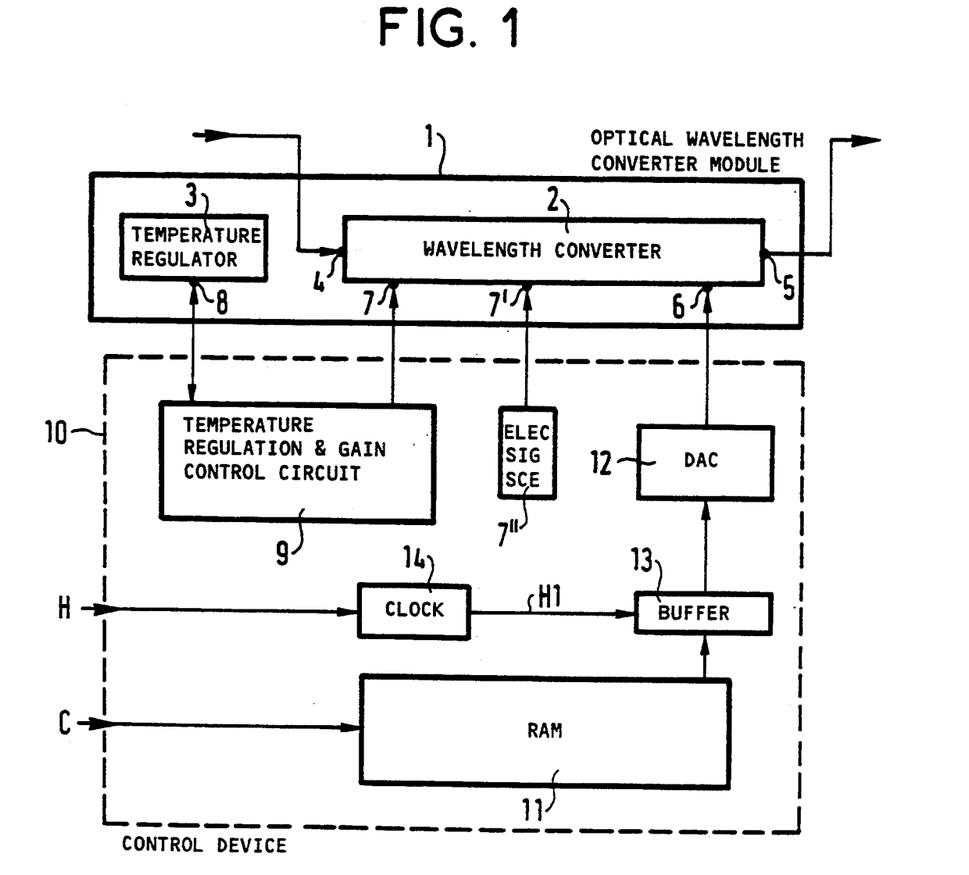
FIG. 1 is a block diagram of a control device in a first embodiment of the invention.

FIG. 1 shows an optical wavelength converter 1 comprising a wavelength converter component 2, in this example a semiconductor laser incorporating a saturable absorber, conventionally associated with a temperature regulator 3, these two components being housed in the same enclosure.

The wavelength converter 2 has an optical signal input 4, an optical signal output 5 and one or more electrical control electrodes, in this example a wavelength control electrode 6, a gain control electrode 7 and a saturable absorber control electrode 7'.

The temperature regulator 3 has control ports 8. It conventionally comprises a temperature sensor and a temperature regulator proper and its ports 8 communicate conventionally with a temperature regulation control circuit 9.

The temperature regulation control circuit 9 is part of a control device 10 of the wavelength converter module 1 and is in this example a temperature regulation and gain control circuit because the gain (which must be kept constant in this example) is regarded as independent of the emission wavelength in this embodiment, being dependent only on temperature.

The control device 10 comprises, in addition to the temperature regulation and gain control circuit 9:

storage means 11 in the form of a random access memory (RAM) in this example addressed by control data C representing the required wavelength for the output optical signal and which, depending on the application, may be obtained from specific data contained in the input optical signal, digital-analog conversion (DAC) means 12 for converting into an analog signal (for example a current) to be applied to the wavelength control electrode 6 data obtained from the RAM 11 addressed by the control data C, and a buffer register 13 for sampling output data from the RAM 11 at a time determined by a clock 14 according to the required time of application of a control signal to the wavelength control electrode 6, this time in turn depending on the type of application intended for the device and being, when the required output wavelength is obtained from specific data contained in the input optical signal, determined on the basis of a clock signal defining the timing of the data modulating the input optical carrier. This clock signal H is applied to the clock 14 which supplies the clock signal H1.

In FIG. 1 the saturable absorber control electrode 7' is also connected to the output of an electric signal source 7'' which supplies, for example, a current whose value will be explained later, in describing a so-called calibration phase of a control method in accordance with the invention.

Figure 2:
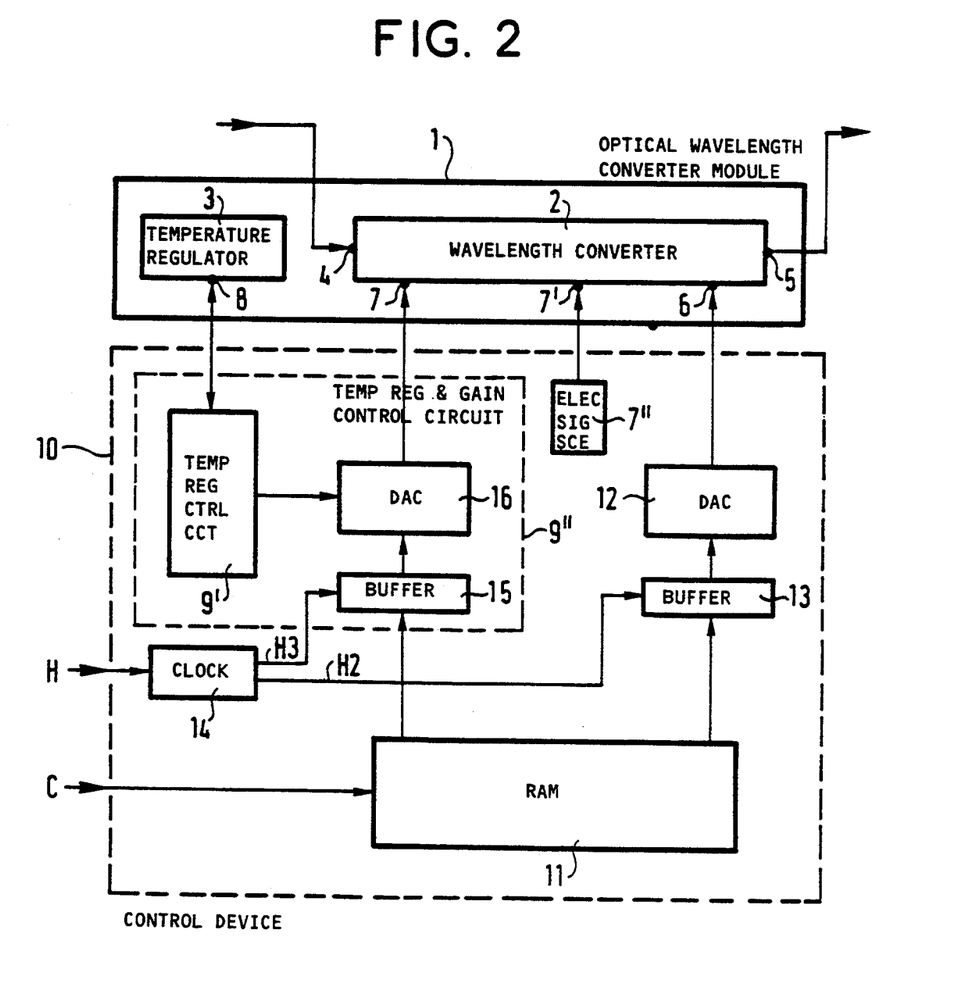
FIG. 2 is a block diagram of a control device in a second embodiment of the invention.

The control device 10 shown in FIG. 2 differs essentially from that shown in FIG. 1 in that the control signal applied to the gain control electrode 7 is obtained in a similar way to that applied to the wavelength control electrodes 6, the gain being regarded as dependent on temperature and wavelength in this embodiment.

The RAM 11 comprises two types of data for each address, data relating to the gain and data relating to the wavelength, the data relating to the gain being applied in a similar manner to the control electrode 7 through a buffer register 15 and a digital-analog converter 16.

In FIG. 2 the clock signals H2 and H3 supplied by the clock 14 respectively control the buffer registers 13 and 15 in a similar way to the signal H1 from FIG. 1.

The digital-analog converter means 16 are somewhat more complex than a mere digital-analog converter, further comprising means for regulating the gain as a function of temperature, as implemented in the temperature regulation and gain control circuit 9 from FIG. 1, which requires a connection between the means 16 and a temperature regulation control circuit 9'. The combination of this circuit 9', the buffer register 15 and the digital-analog converter 16 constitutes a temperature regulation and gain control circuit 9''.

Figure 3:
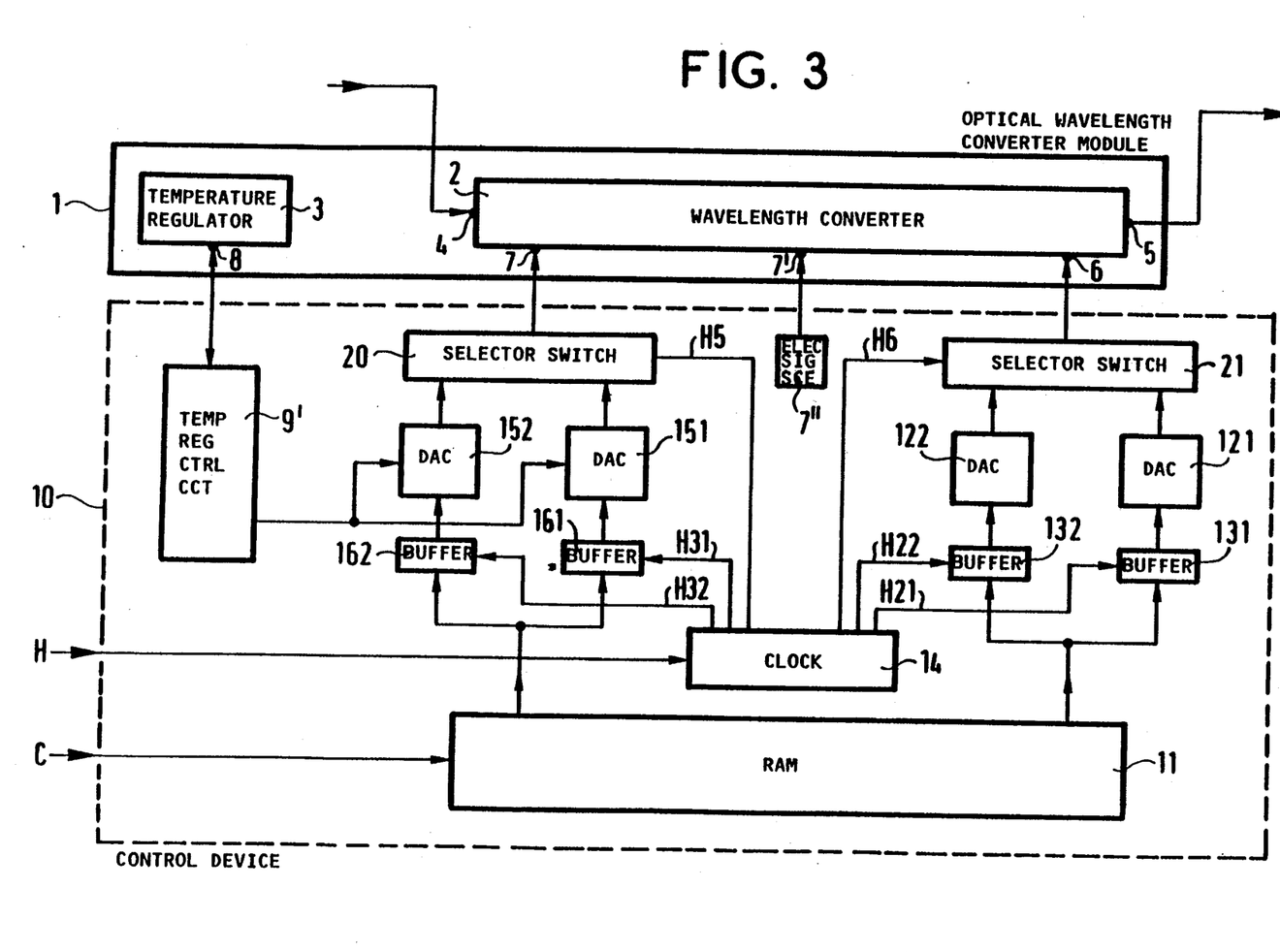
FIG. 3 is a block diagram of a control device in a third embodiment of the invention.

The control device 10 shown in FIG. 3 differs from that shown in FIG. 2 in that each of the wavelength and gain control subsystems is duplicated, in particular for applications like that already mentioned relating to a photonic switching matrix in which the generation by the control subsystem of the respective control signal to be applied to the respective control electrode of this component requires a processing time that is incompatible with the wavelength change timing imposed on the input optical signal.

FIG. 3 shows the digital-analog converter 151, 152 and the buffer register 161, 162 of each of the two gain control subsystems and the digital-analog converter 121, 122 and the buffer register 131, 132 of each of the two wavelength control subsystems.

FIG. 3 also shows the clock signals H21, H22 and H31, H32 supplied by the clock 14 and respectively controlling the buffer registers 131, 132 and the buffer registers 161, 162.

A respective control subsystem selector switch 20, 21 is then required, receiving a respective control clock signal H5, H6 from the clock 14.

Figure 4:
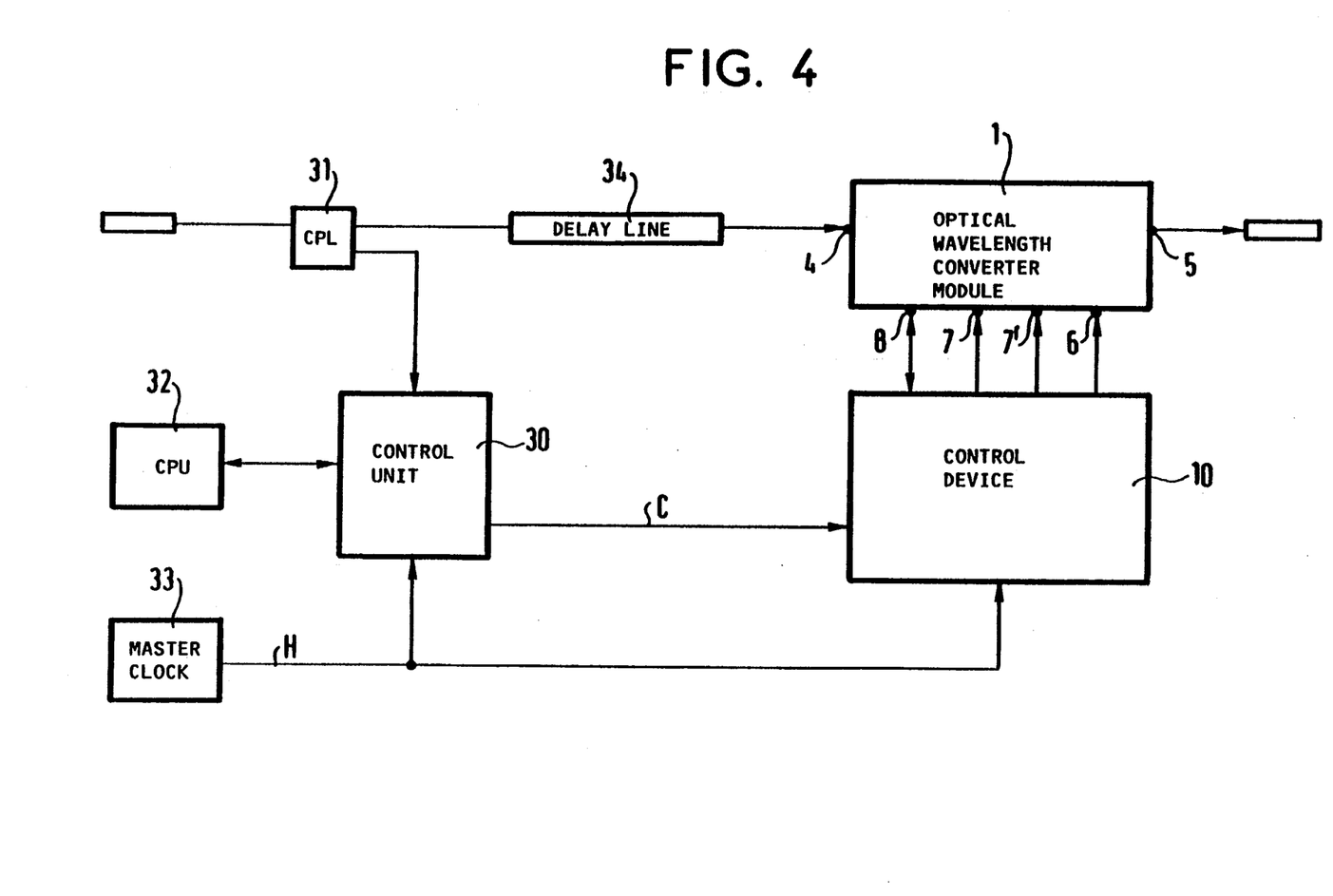
FIG. 4 is a block diagram showing the application of the invention to a photonic switching matrix.

FIG. 4 shows the application of a device in any of the previous embodiments to a photonic switching matrix employing conversion of the wavelength used to transmit input data in the form of asynchronous transfer mode cells.

In this case, and as mentioned above, the wavelength to which each of these cells must be transposed is deduced from specific data contained in the header of each cell. This is why the control data C is supplied by a control unit 30 which receives a fraction of the input optical signal (from a coupler 31), which detects the headers of these cells and which extracts said specific data from these headers, using conventional principles that will not be described here, the unit 30 to this end and conventionally operating under the control of a central processor unit 32 of the switching system incorporating the matrix and a master clock 33 of the switching system.

An optical delay line 34 is included in the optical signal path between the coupler 31 and the wavelength converter module 1 to synchronize the application to the control electrodes of the wavelength converter of the control signals produced by the control device from the control data C produced by the control unit 30 to the application to the optical input of this converter of the cell from which the control unit 30 has derived the control data C.

There will now be described with reference to FIGS. 5, 6 and 7 one implementation of a wavelength converter control device based on the principles shown in the foregoing diagrams and taking by way of example that of FIG. 3 but showing, for reasons of simplification, only one of the two wavelength control subsystems, the other subsystem being implemented in an analogous manner.

Figure 5:
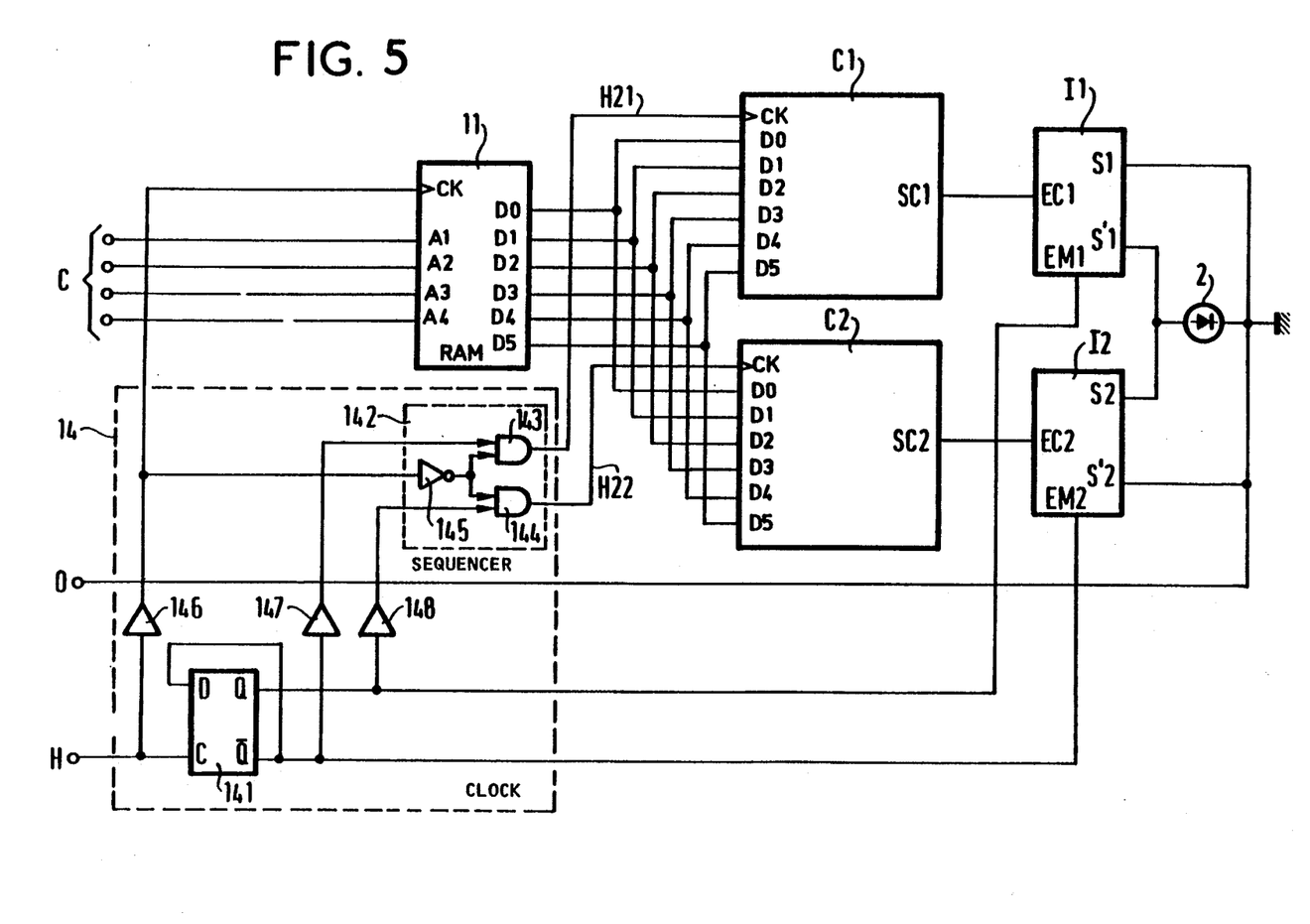
FIGS. 5, 6 and 7 constitute a detailed block diagram of a control device in accordance with the invention which is one example of said third embodiment.

FIG. 5 shows the RAM 11 which receives on its address inputs the digital control data C. The data obtained is fed to the data inputs of two circuits C1 and C2 the clock input CK of which receives a respective clock signal H21, H22 supplied by the clock 14 enabling the two registers to be activated alternately at the same timing as the wavelength changes imposed on the input optical signal, this timing being indicated by the clock signal H applied to the clock 14.

In this example the clock 14 comprises a frequency divider adapted to divide by two conventionally comprising a D-type flip-flop 141 whose inverting output $\bar{Q}$ is looped to the D input, the clock input of this D-type flip-flop receiving the clock signal H, and a sequencer 142 comprising two AND gates 143, 144 and an inverter 145.

Each of the AND gates 143, 144 receives the output signal of the inverter 145 which receives the clock signal H and the respective signals at the inverting ($\bar{Q}$) and non-inverting (Q) outputs of the D-type flip-flop 141.

Figure 6:
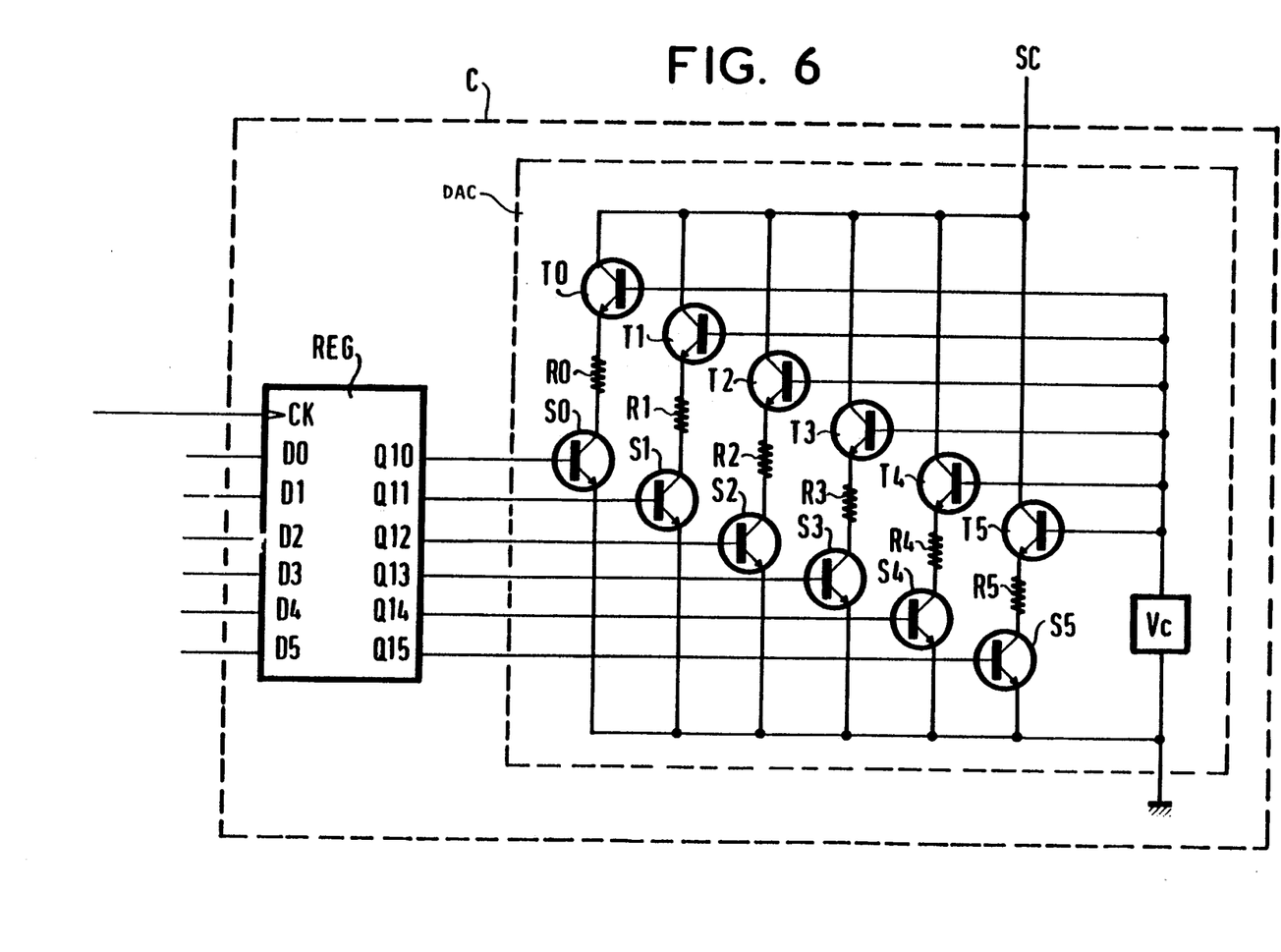

The circuits C1 and C2 are shown in detail in FIG. 6: each of these circuits C combines a register REG (131, 132) and a digital-analog converter DAC (121, 122) one embodiment of which is also shown.

In this example, each digital-analog converter DAC comprises a multi-emitter transistor with m emitters where m is the number of bits in the binary words stored in the memory 11 (m=6, for example). These m emitters T0 through T5 are connected to m respective resistors R0 through R5 whose values respectively represent the binary weights of the bits of the binary words stored in the memory 11 and m respective transistors S0 through S5 controlled by m respective outputs of the RAM via the associated register REG. The multi-emitter transistor is connected to a supply voltage Vc.

The collector current of the multi-emitter transistor is the sum of the m emitter currents of the transistor. This current, controlled on the basis of digital data via the resistors R0 through R5 and the transistors S1 through Sm operating as switches, is the physical current fed to the wavelength control input of the wavelength converter.

Figure 7:
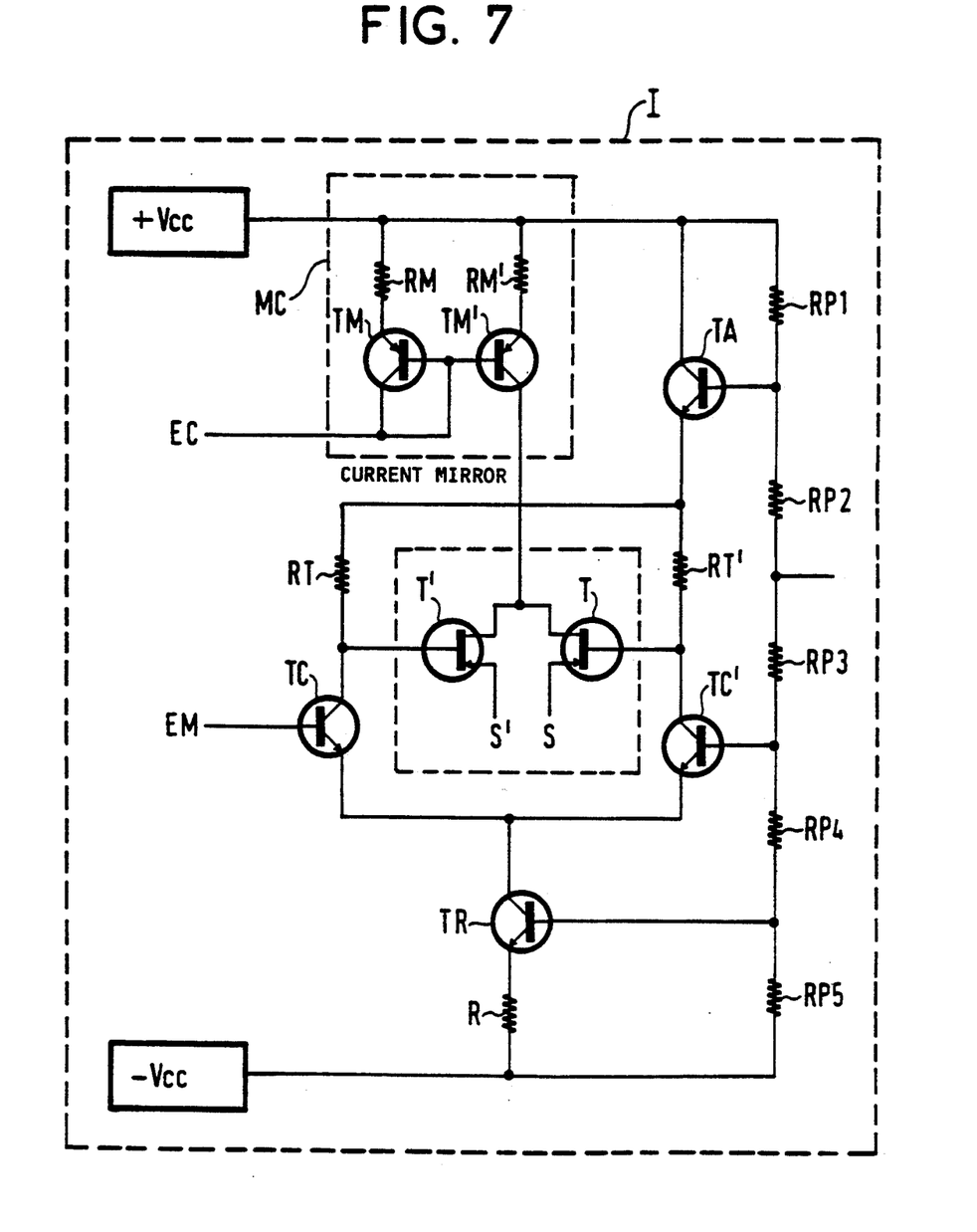

In this example this connection is made through a switch 21 comprising two switches I1 and I2 one embodiment of which is shown in FIG. 7.

Each switch I comprises a current input EC connected to the output SC of the associated digital-analog converter DAC, a marking input EM connected to an output of the divider by two 141 and positive and negative supply voltages +Vcc (positive polarity) and −Vcc (negative polarity).

The structure of the switch I in this embodiment is imposed by physical constraints on the polarity of the electrical signals employed; there are three separate classes of basis circuits constituting the control circuit shown in FIG. 5:

Circuits operating with very short switching times (in the order of one bit period) conventionally implemented in ECL technology (negative logic levels).

Circuits operating at low speed, advantageously implemented in a technology compatible with TTL levels such as the CMOS technology.

Finally, for physical reasons, the current-controlled wavelength converter must be supplied with electrical signals of positive polarity; in other words, this is a common cathode device of the current state of the art.

For these reasons, the function of the switch I is to control the output wavelength of the wavelength converter according to a negative polarity marker signal. One possible implementation is shown in FIG. 7: the wavelength converter proper is energized through a differential pair of field-effect transistors T, T' whose drains are connected together and supplied with current from the output of a current mirror circuit MC and whose sources constitute the outputs S, S' of the switch I. The current mirror circuit MC is connected to the current input EC and conventionally comprises two transistors TM, TM' and two resistors RM, RM'.

The transistor pair T, T' is controlled via a differential NPN transistor pair TC, TC' associated with two resistors RT, RT', the base of one of these transistors receiving the ECL marker signal at the input EM and the emitters of these transistors being connected to a current generator transistor TR associated with a resistor R. A set of resistors RP1 through RP5 and a power supply transistor TA provide the bias voltages required by this circuit.

The connection of the outputs S1, S'1 and S2, S'2 of the switches I1 and I2 to the laser 2 and the connection of the market inputs EM1 and EM2 to the divider 141 enable half-duplex operation.

Finally, in the chosen example the ECL levels of the fast circuits are matched to the TTL levels of the slow circuits by known type level converters 146, 147 and 148.

Figure 8:
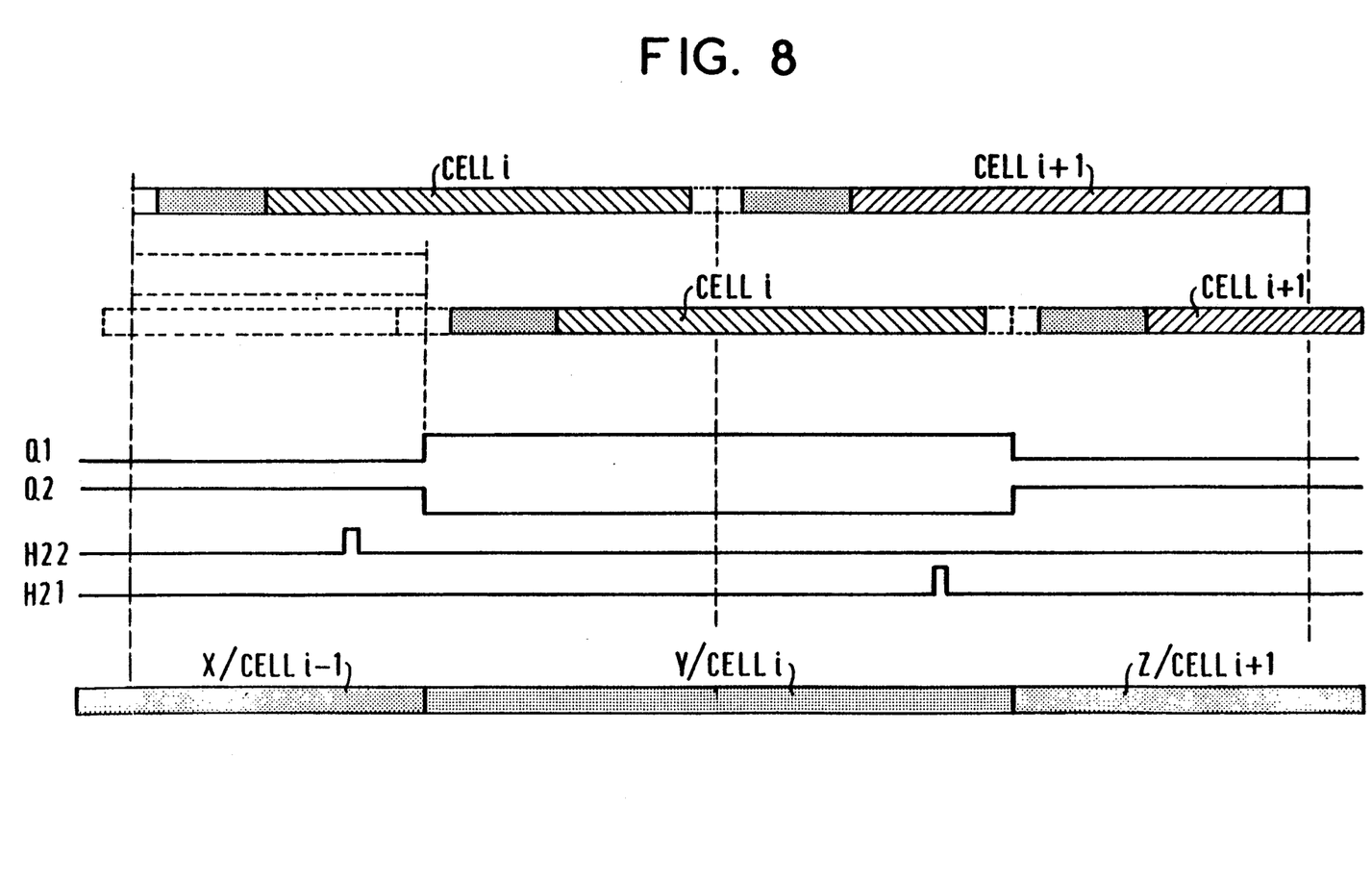
FIG. 8 is a timing diagram relating to said third embodiment of the invention in the example of its application to a photonic switching matrix as shown in FIG. 4.

There will now be described the FIG. 8 timing diagram showing the operation of a device like that from FIG. 1, for example, in the instance of application of this device to a photonic switching matrix as shown in FIG. 4. The first line of this timing diagram shows two cells CELL i and CELL i+1 separated by guard times and each comprising a header (shaded area) and an information field (cross-hatched area). The two cells shown are those appearing at the input of the FIG. 4 device, that is to say at the input of the coupler 31. The next line shows the same cells applied to the optical signal input of the converter with an optical time-delay determined by the delay line 34 and essentially representing the processing time required by the control unit 30, this processing comprising reception (extraction of the specific data from the received cells), routing (path calculation using this specific data) and marking (application of the control data C to the wavelength converter) operations.

The next two lines of the timing diagram respectively show the control signals Q1 and Q2 respectively applied to the switches 211 and 212 of FIG. 5.

The next two lines of the timing diagram respectively show the clock signals H21 and H22, for example, applied to the buffer registers of the two wavelength control subsystems.

The last line of the timing diagram shows the succession of wavelengths applied to the wavelength control electrode of the converter: in this instance the wavelength "x" for the cell CELL i−1, the wavelength "y" for the cell CELL i and the wavelength "z" for the cell CELL i+1.

Figure 9:
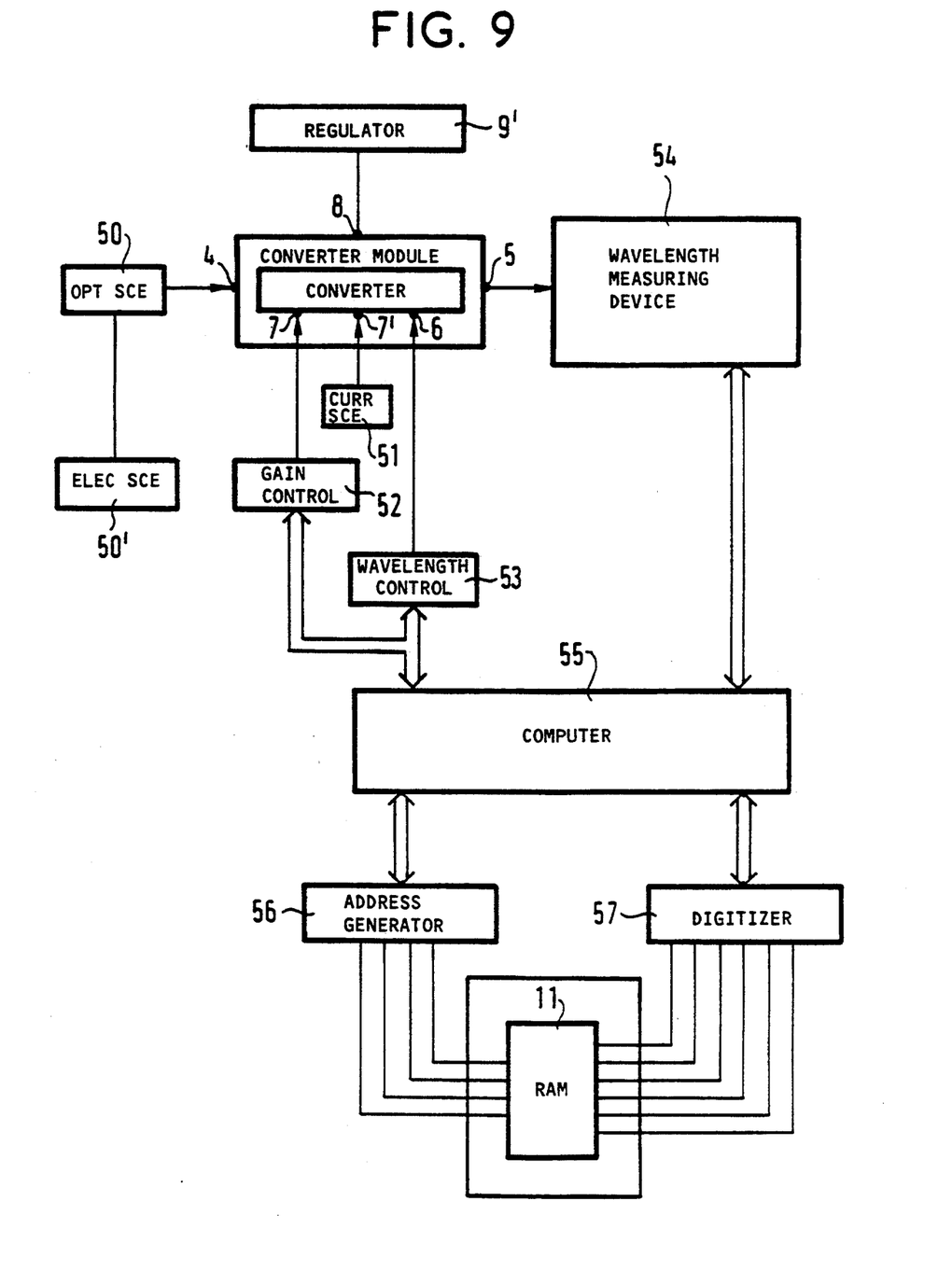
FIG. 9 is a block diagram of one possible circuit for implementing a so-called calibration phase of a control method in accordance with the invention.

There will now be described with reference to FIG. 9 a circuit for implementing a so-called calibration phase of a control method in accordance with the invention.

There is no simple mathematical law of general application linking the value of the wavelength emitted by a tunable semiconductor laser (and therefore a wavelength converter) to the value of the electric currents or voltages applied to this component. It is therefore necessary to record (or map) the emission characteristics of the component as a function of its control characteristics.

This provides a set of precise values of the control currents for setting the laser to emit a predetermined set of wavelengths at a nominal operating temperature.

For this purpose the wavelength converter is set to operate continuously by an incident optical signal supplied by a control optical signal source 50 (fed by an electrical signal source 50′) and characterized by a continuous luminous flux whose power is near the nominal power Po at which the component operates in optical triggered mode.

The saturable absorber control electrode 7′ of the converter receives from a current source 51 a fixed control current I20 also representing a nominal operating current of the component in optical triggered mode.

With the gain control current I1 applied to the gain control electrode 7 the saturable absorber control current I20 determines the operating points for which the laser is triggerable optically by means of the power $P_O$.

In this instance all of these operating points are in a region between first and second curves established under the following conditions:

for the first curve with:
I1 increasing,
I2 fixed and equal to I20,
constant input optical power injected into the laser equal to $P_O$,
for the second curve with:
I1 decreasing,
I2 fixed and equal to I20,
input optical power injected into the laser equal to zero.

Note that the current I20 is also that flowing to the saturable absorber control electrode during the so-called operative phase of a control method in accordance with the invention and that the input optical power $P_O$ is also that of the input light signal during this operative phase.

To measure the emission wavelength as a function of the control characteristics of the laser the wavelength emitted by the laser is measured for each value of the gain control current I1 and the wavelength control current I3, the values of I1 being chosen in the region representing the operating points of the laser as defined above.

Because the wavelength depends essentially on the control current I3, this yields a set of ranges of values separated by more abrupt jumps on changing the value of the control current I3.

To carry out this measurement the component is regulated to its nominal operating temperature by a regulator 9′ and is supplied by respective gain control signal I1 and wavelength control signal I3 generators 52, 53 which are calibrated generators with appropriate characteristics (resolution, precision and reproducibility) for accurate control of wavelength tuning.

The signal emitted by the component is coupled to a prior art wavelength measuring device 54 of the interferometer or spectrophotometer type capable of providing with sufficient accuracy the mean value of the emission wavelength.

The map can be stored under the control of a computer 55 which collects the sampled measurements effected by the wavelength measuring unit.

The RAM 11 is then programmed using the wavelength value as an address (supplied by an address generator 56 controlled by the computer) to store a binary number on "m" bits (supplied by a digitizer 57 controlled by the computer 55) representing the equivalent of the (analog) current sampled on "m" bits to be applied to the m emitters of the digital-analog converter supplying the component.

There is claimed:

1. Method of controlling an optical wavelength converter according to a required output wavelength, said wavelength converter having an optical signal input to which is applied an input optical signal whose wavelength is to be converted, an optical signal output at which appears an output optical signal whose wavelength is the required wavelength, and at least one control electrode to which is applied a respective analog electrical control signal to control the wavelength of the output optical signal, said method comprising:

a calibration phase comprising the steps:
establishing a mathematical relationship between the magnitude of said electrical control signal and the wavelength of said output optical signal, and
storing said mathematical relationship in an addressable digital storage means as respective values of said control signal each associated with a different value of said wavelength; and an operative phase comprising the steps:
using a digital signal corresponding to the required output wavelength to address said storage means and obtain an associated digital signal corresponding to an associated said control signal, and
converting the thus-obtained associated digital signal into said analog control signal, for application to said control electrode.

2. Method according to claim 1 wherein said optical wavelength converter is a semiconductor laser incorporating a saturable absorber having a wavelength control electrode, and said at least one control electrode includes said wavelength control electrode.

3. Method according to claim 2 wherein said at least one control electrode also includes a gain control electrode to which is applied a second analog electrical signal which is calibrated and applied in accordance with said method.

4. Device for implementing a method of controlling an optical wavelength converter according to a required output wavelength, said wavelength converter having an optical signal input to which is applied an input optical signal whose wavelength is to be converted, an optical signal output at which appears an output optical signal whose wavelength is the required wavelength, and at least one control electrode to which is applied a respective analog electrical control signal to control the wavelength of the output optical signal, said device comprising:

calibrating means for establishing a mathematical relationship between said analog electrical control signal and the wavelength of output output optical signal,
storage means for storing said mathematical relationship in digital form,
addressing means responsive to a required output wavelength for addressing said storage means to obtain a digital representation of said analog electrical signal corresponding to said required output wavelength,
digital-to-analog converting means for converting the thus-obtained digital representation into said analog electrical signal for application to said control electrode.

5. Device according to claim 4 wherein said digital-to-analog converting means further comprises
two digital-analog converters for alternately converting data from the storage means at a timing rate imposed for wavelength conversion on the input optical signal and
a switch selecting alternately data from one or the other of said digital-analog converters.

* * * * *